United States Patent [19]

Sato

[11] 4,354,258
[45] Oct. 12, 1982

[54] MEMORY BOARD AUTOMATICALLY ASSIGNED ITS ADDRESS RANGE BY ITS POSITION

[75] Inventor: Fumitaka Sato, Ome, Japan

[73] Assignee: Tokyo Shibaura Denki Kabushiki Kaisha, Kawasaki, Japan

[21] Appl. No.: 120,469

[22] Filed: Feb. 11, 1980

[30] Foreign Application Priority Data

Feb. 16, 1979 [JP] Japan .................................. 54-16015

[51] Int. Cl.³ .............................................. G11C 8/00
[52] U.S. Cl. .................................................. 365/230
[58] Field of Search ................ 365/230, 200; 364/900

[56] References Cited

U.S. PATENT DOCUMENTS 3,796,996 3/1974 Curley et al. ....................... 364/200
3,872,452 3/1975 Stoops ................................. 365/230

OTHER PUBLICATIONS

IBM Technical Disclosure Bulletin-vol. 15, No. 12, May 1973, pp. 3587-3591.

Primary Examiner—James W. Moffitt
Attorney, Agent, or Firm—Kenyon & Kenyon

[57] ABSTRACT

A subtractor circuit subtracts start address information supplied from address information to produce a logical address. An adder circuit adds the start address information to memory capacity information to form the start address of the succeeding memory board. When $0 \leq$ output information from the subtraction circuit $<$ memory capacity information, a memory board is selected. To obtain the selection signal, a comparing circuit is provided which compares the output information from the subtractor circuit with the memory capacity information.

12 Claims, 8 Drawing Figures

MEMORY BOARD AUTOMATICALLY ASSIGNED ITS ADDRESS RANGE BY ITS POSITION

BACKGROUND OF THE INVENTION

The present invention relates to a memory board forming a memory device in a data processing system and, more particularly, to a memory board in which, when a plurality of memory boards are inserted into a mother board, the selection of each memory board may be made with a simple circuit without any manual operation of assigning the address range of each memory board.

A memory device used in an electronic computer is generally constructed such that a plurality of memory boards of the same kind are inserted into a mother board with properly-wired contact terminals. For example, in the case of a memory device with a maximum memory capacity of 512 KB (kilobytes, K=1024), eight memory boards are required for the construction of the memory device when each memory board has a memory capacity for 64 KB. Similarly, two memory boards are necessary for the construction of a memory device when each memory board has a memory capacity of 128 KB; four memory boards for a memory device with a memory capacity of 256 KB.

For constructing memory devices with memory capacities of 256 KB, 128 KB and 64 KB by using a memory board with a maximum memory capacity of 512 KB, for example, a number of memory chips are mounted on the memory board corresponding to $\frac{1}{2}$, $\frac{1}{4}$ and $\frac{1}{8}$, respectively, the number of those memory chips mounted on the memory board to achieve the 512 KB capacity. Accordingly, those memory devices have spaces where no memory chips are located on the memory boards, respectively.

Before use, the addresses of the memory board must be set. For example, in the case of the memory board of 64 KB, it is determined what addresses are assigned to the memory board; for exammple, 0 to (64K-1)B, 128 KB to (192K-1)B or 256 KB to (320K-1)B. For such an address assignment, two methods are known; one using base address switches for the respective memory boards and the other employing jumper wires. In the former method, the start address of a memory board is set by the base address switch associated with the memory board. Disadvantages of this method are the base address switches must be used and the start address must be set every time the memory board is inserted into the mother board. In the latter method, the start address of the memory board is set in a manner such that a memory address transferred from a central processing unit or an input/output control unit is decoded by a decoder and the output terminal of the decoder is coupled with the address line of the memory board by the jumper wire. The major disadvantage of this method is that jumper wiring must be made every time the memory board is inserted into the mother board.

SUMMARY OF THE INVENTION

Accordingly, an object of the invention is to provide a memory board in which addresses of memory locations on the memory board may automatically be assigned to the board in a manner such that the jumper wiring representing a memory capacity of the memory board is made at the manufacturing stage and the memory board is merely inserted into a mother board at the system construction stage.

Another object of the invention is to provide a memory board which allows a memory device with a proper memory capacity to be constructed by combining a plurality of memory boards with various memory capacities at the system construction stage without the use of jumper wiring from a mother board, without jumper wiring in a memory control circuit to control an overall of the memory device or base address switches.

To achieve the above objects, there is provided a memory board in which a plurality of memory locations are arranged thereon by mounting a plurality of memory chips, comprising first terminals for receiving address information for specifying one of said memory locations, second terminals for receiving start address information corresponding to the first memory location of those memory locations, means for supplying memory capacity information representing a capacity of the plurality of memory locations, addition means for adding the start address information to the memory capacity information, third terminals through which the output information of said addition means is outputted, subtraction means for subtracting the start address information from the address information and means for producing a selection signal for selecting a memory board when the information (the address information—the start address information) outputted from the subtraction means is given by the following expression:

$0 \leq$ (the address information—the start address information) $<$ the memory capacity information.

Other objects and features of the invention will be apparent from the following description taken in connection with the accompanying drawings, in which:

DETAILED DESCRIPTION OF THE PREFERRED EMBODIMENTS

Figure 1:
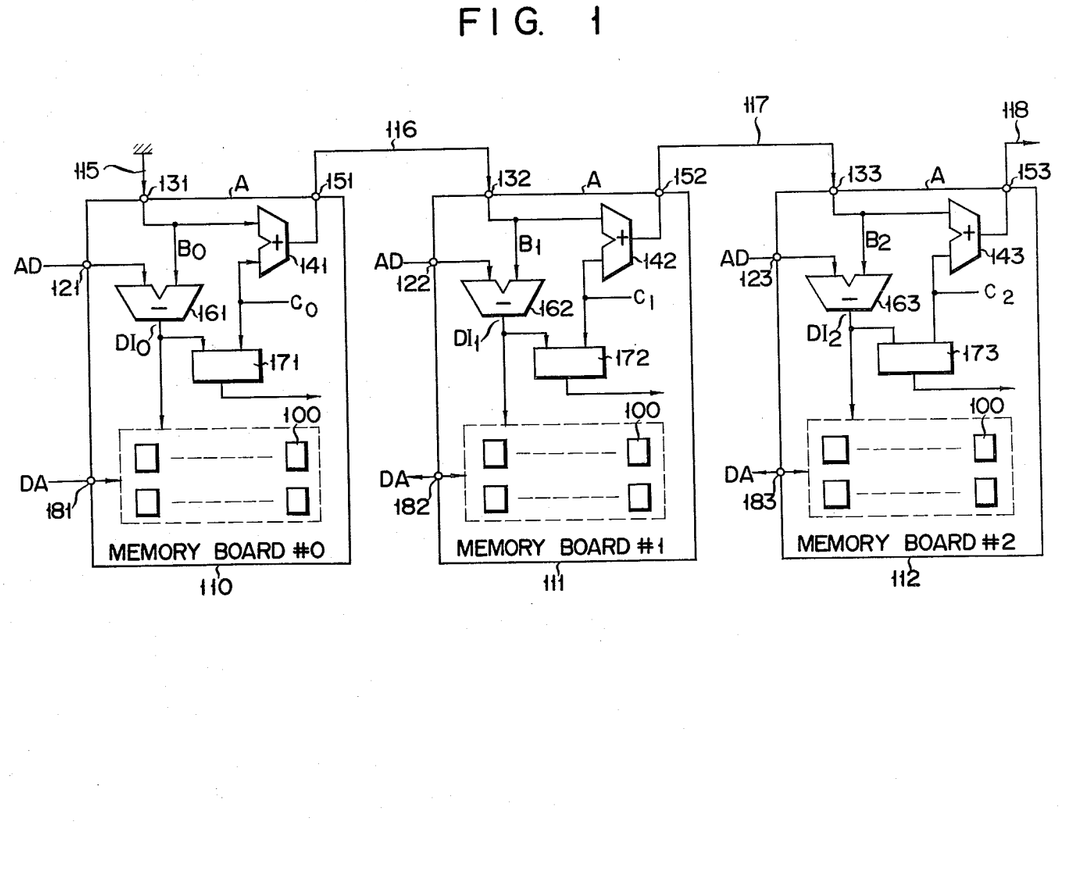
FIG. 1 shows a block diagram of an embodiment in which a plurality of memory boards according to the invention are inserted into a mother board.

Referring to FIG. 1, there is shown an embodiment of a plurality of memory boards inserted into a mother board. As shown, in a computer system, the necessary number of memory boards #0, #1, #2, ... are mounted to a mother board (not shown). Lines 115 and 118 found on the sides A of the memory boards #0 110, and #2 112 are wires of the mother board. A discretionary number of memory chips 100 are mounted on those memory boards #0 110, #1 111 and #2 112 to form memory circuits. In other words, a plurality of memory locations are formed by mounting the memory chips on each of the memory boards #0 110, #1 111, and #2 112. A program or data necessary for data processing is written in the memory chips when a computer starts to operate. A device, such as a CPU or a channel device for accessing the memory transfers the address to the memory chips to cause read-out or write-in of the program or the data from a memory location corresponding to the address. Those memory boards include adder circuits 141 to 143. A signal representing a memory capacity of each memory board is applied to one of the input terminals of the adder circuit of the corresponding memory board. When the respective memory boards #0 to #2 are manufactured, jumper wiring only has to be connected on the respective board to obtain the memory capacity signal. Only one jumper wire is required for the jumper wiring and therefore it is easy and simple.

In those memory boards #0 110, #1 111 and #2 112, first terminals such as 121 to 123 receive the address information AD with given bit widths to specify specific memory locations of the locations formed by the memory chips 100. Although each first terminal is illustrated as a single terminal in the drawing, it actually consists of a plurality of terminals. This is true for remaining terminals. Second terminals such as 131 to 133 receive start address information $B_0$ to $B_2$ of the first memory locations of those locations of the memory boards. The memory boards include means for generating memory capacity information $C_0$ to $C_2$ which are representative of the memory capacities of the plurality of the memory locations. Such memory capacity information is set up by wiring jumper lines at the manufacturing stage of the memory boards #0 to #2. In this case, a single jumper line is wired for each memory board, thus causing little trouble in manufacturing. Adder circuits such as 141 to 143 included in the memory boards #0 to #2 receive at the inputs the start address information $B_0$ to $B_2$ and the memory capacity information $C_0$ to $C_2$, respectively, as shown. The memory boards #0 to #2 further include third terminals such as 151 to 153, through which the output information from the adder circuits 141 to 143 are outputted. Subtraction circuits such as 161 to 163 subtract the address information $B_0$ to $B_2$ from the address data AD, respectively. The information $DI_0$ to $DI_2$ produced from the subtraction circuits 161 to 163 and the memory capacity information $C_0$ to $C_2$ are correspondingly applied to comparing circuits such as 171 to 173. When the output information $DI_0$ from the subtraction circuit 161 is given by $0 \leq DI_0 < C_0$, the comparing circuit 171 produces a selection signal for selecting the memory board #0 110. When the output data $DI_1$ from the subtraction circuit 162 is related by a relation $0 \leq DI_1 < CI$, the comparing circuit 172 produces a selection signal for selecting the memory board #1 111. Similarly, the comparing circuit 173 produces a selection signal to select the memory board #2 112 when the output information $DI_2$ from the subtraction circuit 163 is related by a relation $0 \leq DI_2 < C_2$. The selection signal is transferred to a source means to make an access to the memory circuit, for example, a central processing unit.

Description will be given made of the interconnection of the memory boards. Start address information (all "0") is applied to one of the input terminals of the adder circuit 141 within the memory board #110. The output information from the adder circuit 141 is applied to one of the input terminals of the adder circuit 142, through the terminal 151, a line 116 of the mother board and the terminal 132. Similarly, the output information from the adder circuit 142 is transferred to one of the input terminals of the adder circuit 143, through the terminal 152, a line 117 of the mother board and the terminal 133.

In brief, when the memory board according to the invention is used, the start address information $B_1$ of the memory board #1 is calculated in the adder circuit 141 and the calculated start address is applied to the memory board #1 by way of the line 116. In the memory board #1, the start address information $B_2$ of the memory board #2 is calculated by the adder circuit 142 and the calculated start address is supplied to the memory board #2, through the line 117. In other words, a memory board calculates the start address of the next memory board and transfers the calculated start address to the next memory board via the mother board.

Accordingly, when the memory boards according to the invention are assembled into the mother board, no circuit construction for the assembly must be taken into account. Therefore, in manufacturing the memory board, a discretionary number of memory chips may be mounted on a memory board to form a memory board with a discretionary memory capacity. Further, in manufacturing, a single jumper line is merely connected so as to apply the memory capacity information to the other input terminal of the adder circuit.

Further, according to the invention, the start address data of a memory board may be treated as the address 0 of the memory board. As described above, the start address information $B_1$ of the memory board #1 is the output information of the adder circuit 141 of the memory board #0 at the preceding stage. In the subtraction circuit 162 of the memory board #1, the subtraction of the address information AD-the start address information B1 is currently performed. The result of the subtraction is the memory address information when the start address information $B_1$ is treated as the address 0. Accordingly, a plurality of the memory locations of the memory chips mounted on the memory board #1 111 are specified by the memory address information. Further, a memory board in which addresses of memory locations on the memory board may automatically be assigned to the board in such a manner that jumper wiring representing a memory capacity of the memory board is made at the manufacturing stage and the memory board is merely inserted into a mother board at the system construction stage.

Figures 2, 3, 4:
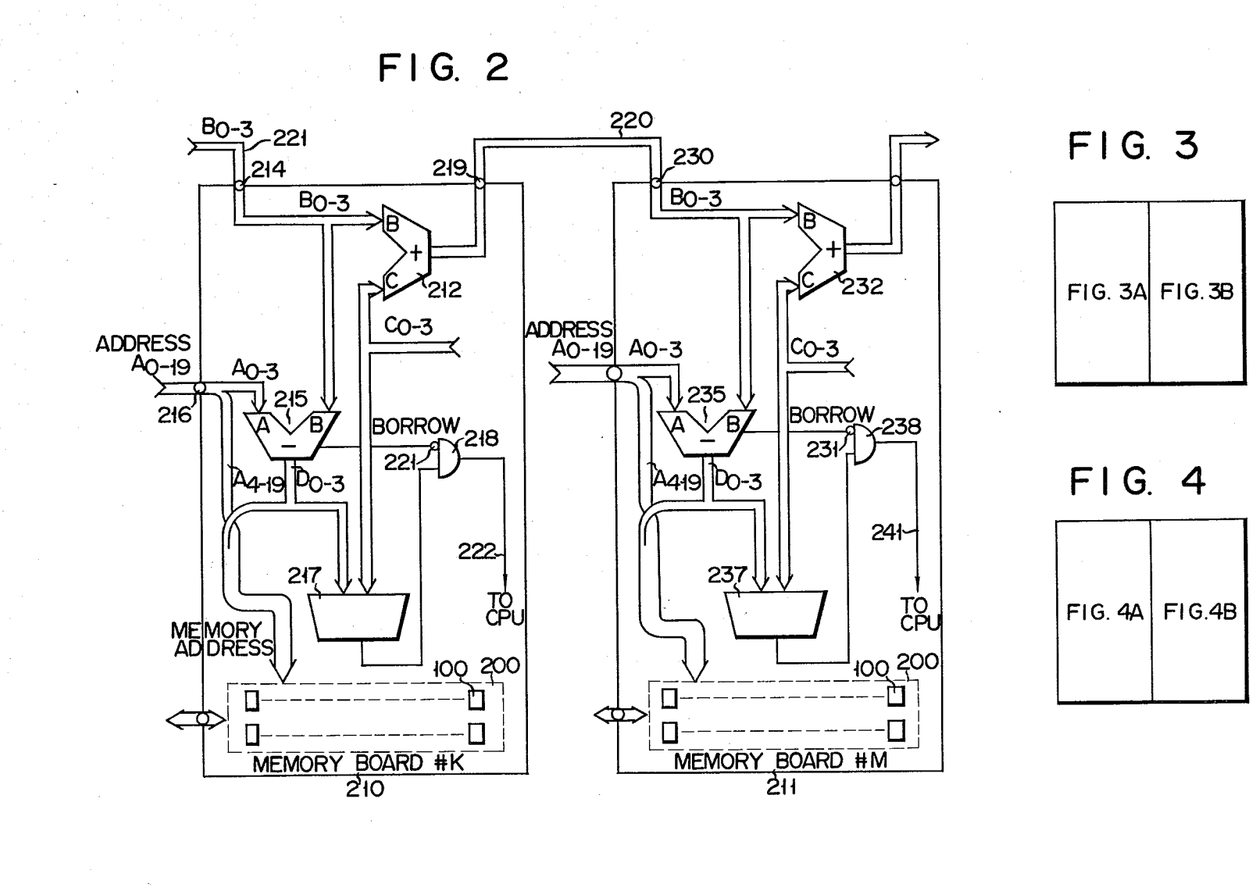
FIG. 2 shows a detailed block diagram of the embodiment shown in FIG. 1.
FIG. 3 shows the relationship of FIGS. 3A and 3B.
FIG. 4 shows the relationship of FIGS. 4A and 4B.

Turning now to FIG. 2, there is shown a circuit diagram illustrating the circuit in FIG. 1 in more detail. The embodiment of FIG. 2 employs a memory board which allows a range of $2^m$ KB (e.g. 64 KB) to $2^n$ KB (e.g. 512 KB) of memory locations to be formed thereon by mounting memory chips thereon. In the expressions, m and n are positive integers with a relation $m < n$, K=1,024 and B represents a byte. In FIG. 2, an address subtraction circuit and a circuit for providing a selection signal are shown. Like FIG. 1, only the memory chip 100 is illustrated for a memory circuit 200 in FIG. 2. Although two memory boards #K 210 and #M 211 are illustrated, the hardware constructions of the two boards are the same. Accordingly, only the memory board #K 210 will be used in the following description. In the memory board #K 210, an adder circuit 212 is the same as circuit 141 of FIG. 1. In the circuit in FIG. 2, it is assumed that the total memory capacity of the memory device when the necessary number of the memory boards shown in FIG. 2 are inserted into a mother board, is 1 MB (megabytes). Accordingly, the addresses assigned to each memory board #K 210 and #M 211 are addresses $A_0$ to $A_{19}$ of 20 bits. The start address information $B_{0-3}$ has been applied from the adder circuit of the preceding memory boad to terminal 214 of the memory board 210, through a line 221 on the mother board (not shown). Although the terminal 214 is depicted as a single terminal in the figure, it actually consists of four terminals and has a four-bit width. The start address information $B_{0-3}$ is applied to one of the input terminals of an adder circuit 212 and to one of the input terminals of the address subtraction circuit 215. The address information $A_{0-19}$ to address the memory circuit of the memory board #K comes in through a terminal 216 of four-bit width. The terminal 216 illustrated as a single terminal actually consists of four terminals. The upper four bits $A_{0-3}$ of the address information are applied to the other input terminal of the address subtraction circuit 215. The output data $D_{0-3}$ i.e. the result of the subtraction "the address information of the upper four bits"-"the start address information", is added to the upper bits $A_{4-19}$. As a result, address data to drive the memory circuit of the memory board #K 210 is formed. The output information $D_{0-3}$ of the address subtraction circuit 215 is inputted to one of the inputs of a comparing circuit 217. Memory capacity information $C_{0-3}$ representative of a memory capacity of the memory board #K 210 is applied to the other input of the comparing circuit 217. The comparing circuit 217 compares both the information and produces an output signal of logical "1" when $D_{0-3} < C_{0-3}$. The logical "1" signal is applied to one of the inputs of an AND gate 218. A BORROW signal derived from the address subtraction circuit 215 is inverted by an inverter 221 and then is applied to the other input of the AND gate 218. The output signal from the AND gate 218 becomes a selection signal 222 to select the memory board #K 210. The selection signal 222 is produced from the AND gate 218 when the output information $D_{0-3}$ of the subtraction circuit 215 $0 \leq (D_{0-3} - C_{0-3}) < C_{0-3}$ and is transferred to a central processing circuit CPU (not shown). The memory capacity information $C_{0-3}$ representative of a memory capacity of the memory board #K is applied to the other input terminal of the adder circuit 212. The result of the addition $(B_{0-3} + C_{0-3})$ produced from the adder circuit 212 becomes the start address information $B_{0-3}$ of the next memory board #M 211 which is applied to the input terminal of the memory board #M 211, through a terminal 219 and the line 220 on the mother board. Although the terminal 219 is depicted as a single terminal, it has a four-bit width and consists of four terminals actually.

The operation of the memory board thus constructed will be described hereinafter. As will be recalled, the jumper wiring to obtain the memory capacity information $C_{0-3}$ representing the memory board has been made at the manufacturing stage of the memory bord #K 210. The memory capacity information $C_{0-3}$ and the memory capacity are related to each other as in the following Table 1, for example.

TABLE 1

| Memory Capacity | Memory Capacity Information | | | |
|---|---|---|---|---|
| | $C_0$ | $C_1$ | $C_2$ | $C_3$ |
| 64 KB | 0 | 0 | 0 | 1 |
| 128 KB | 0 | 0 | 1 | 0 |
| 256 KB | 0 | 1 | 0 | 0 |
| 512 KB | 1 | 0 | 0 | 0 |

When $C_3$ (bit 3) of the memory capacity information $C_{0-3}$ of 4 bits is a logical "1", it indicates that the memory capacity is 64 KB. When $C_2$ (bit 2) is a logical "1", it indicates 128 KB of memory capacity. When $C_1$ (bit 1) is a logical "1", it indicates 256 KB. When $C_0$ (bit 0) is a logical "1", it indicates 512 KB. When the memory capacity is defined by the power of 2, the information of the memory capacity may be expressed by several bits (4 bits in this embodiment). The upper-bit width of the memory address information ($A_0$ to $A_3$ in this embodiment) is determined on the basis of the memory capacity information. The address range to make an access to the memory circuit of the memory board #K 210 is determined depending on the start address ($B_{0-3}$) supplied through the terminal 214 and the memory capacity information ($C_{0-3}$). The address range of the memory board #K 210, which depends on the relation of the memory capacity of the memory board #K 210 and the address information $B_{0-3}$, is illustrated in Table 2.

TABLE 2

K = 1024
Memory Capacity
Memory capacity of memory board #K

| Start Address | 64KB $C_{0-3}=$ 0001 | 128KB $C_{0-3}=$ 0010 | 256KB $C_{0-3}=$ 0100 | 512KB $C_{0-3}=$ 1000 |
|---|---|---|---|---|
| 0 ($B_{0-3}=0000$) | 0~ 64K-1 | 0~ 128K-1 | 0~ 256K-1 | 0~ 512K-1 |
| 64K ($B_{0-3}=0001$) | 64K~ 128K-1 | 64K~ 192K-1 | 64K~ 320K-1 | 64K~ 576K-1 |
| 128K ($B_{0-3}=0010$) | 128K~ 192K-1 | 128K~ 256K-1 | 128K~ 384K-1 | 128K~ 640K-1 |
| 256K ($B_{0-3}=0100$) | 256K~ 320K-1 | 256K~ 384K-1 | 256K~ 512K-1 | 256K~ 768K-1 |
| 512K ($B_{0-3}=1000$) | 512K~ 576K-1 | 512K~ 640K-1 | 512K~ 768K-1 | 512K~ 1024K-1 |

As seen from Table 2, when the start address information $B_{0-3}$ is "0000" and the memory capacity information $C_{0-3}$, for example, the address range of the memory board #K 210 is 0 to 64 K-1 (K=1024). Further, when the start address information $B_{0-3}$ is "1000" and the memory capacity information $C_{0-3}$ is "1000", the address range allowed by the memory board #K 210 is 512 K to 1024 K-1. When the start address information $B_{0-3}$ of the memory board #K 210 is "0000", the terminal 214 of the memory board #K 210 is grounded. The memory boards of the invention are manufactured the same regardless of the address range shown in Table 2, because it is so designed that the start address information $B_{0-3}$ may be treated as the logical address 0 of each memory board. For example, by subtracting the start address information $B_{0-3}$ coming in through the terminal 214 from the upper four bits $A_{0-3}$ of the address information $A_{0-19}$ of 20 bits, ($A_{0-3} - B_{0-3}$), the address information $B_{0-3}$ may be treated as the address 0. This subtraction is performed by the address subtraction circuit 215. The output information $D_{0-3}$ of the address subtraction circuit 215 is added to the upper part of the address information $A_{4-19}$ and the result is used to as a memory address to specify the memory locations of the memory chips 100.

A description of the condition of the memory capacity information and the start address information for selecting the memory board. Assume that the capacities of the memory locations constituted by the memory chips 100 mounted on the memory boards #K 210 and #M 211 are each 64 KB. In other words, the memory capacity information $C_{0-3}$ is "0001". The respective memory boards may of course have different memory capacities. It is further assumed that the start address information of the memory board #K 210 is the address 64 K (K=1024). The start address information coming from the terminal 214 is accordingly "0001". As a result, the address range of the memory board #K 210 with the memory capacity of 64 KB is the addresses 64 K to 128 K-1, as seen from Table 2. The start address information $B_{0-3}$ of the memory board #M 211 is "0010". Further, the address range of the memory board #M 211 with the memory capacity of 64 KB is the addresses 128 K to 192 K-1, as seen from Table 2.

Assuming now that the address information $A_{0-19}$ coming in through the terminal 216 of a 20-bit width of the memory board #K 210 indicates an address with an address number smaller than that of the address 64 K-1, and the upper 4 bits of the address information $A_{0-3}$ are "0000". Here, $A_0$ is MSB and $A_{19}$ is LSB. The address information $A_0$ through $A_{19}$ is an address transferred from a CPU or a channel device. The address information $A_{0-3}$ "0000" has been applied to one of the input terminals of the subtraction circuit 215. The start address $B_{0-3}$ coming in through the terminal 214 of a 4-bit width is "0001". In this case, $B_0$ is MSB and $B_3$ is LSB. The start address information $B_{0-3}=$ "0001" has been applied to the other input information of the subtraction circuit 215. The subtraction circuit 215 performs the subtraction $(A_{0-3})-(B_{0-3})$ to produce the output information $D_{0-3}=$"1111". Since $A_{0-3} > B_{0-3}$, a BORROW signal of logical "1" is produced. The BORROW signal of logical "1" is inverted by the inverter 221 to be logical "0" which in turn is applied to one of the input terminals of the AND gate 218. The output signal $D_{0-1}=$"1111" of the subtractor circuit 215 is applied to one of the input terminals of the comparing circuit 217. The memory capacity information $C_{0-3}=$"0001" is applied to the other input terminal of the comparing circuit. Accordingly, $D_{0-3} > C_{0-3}$ and this fails to meet the relation $D_{0-3} < C_{0-3}$, so that the comparing circuit 217 also produces a signal of logical "0". The logical "0" signal is applied to the other input terminal of the AND gate 218. Accordingly, the AND gate 218 produces a logical "0" signal onto the output line 222. When the output signal from the AND gate 218 is logical "0", the memory board #K 210 is not selected. In other words, the output data $D_{0-3}$ from the subtraction circuit does not satisfy the condition $0 \leq (D_{0-3} - C_{0-3}) < C_{0-3}$. This assumes that the circuit of memory board #K 210 operates with positive logic. The memory board selection signal is an answer back signal to the CPU.

When the address information $A_{0-19}$ inputted through the terminal 216 of a 20-bit width indicates the address 128 K-1, the upper four bits $A_{0-3}$ of the address information is "0001". Accordingly applied to the subtraction circuit 215 are the bit address information $A_{0-3}=$"0001" and the start address information $B_{0-3}=$"0001". The subtraction circuit 215 performs the subtraction $(A_{0-3})-(B_{0-3})$, similarly. Then, it produces the subtraction result information $D_{0-3}=$"0000". At this time, the BORROW signal from the subtraction circuit 215 is logical "0". The logical "0" signal is inverted by the inverter 221 to be logical "1" which in turn is applied to one of the input terminals of the AND gate 218. The information $D_{0-3}=$"0000" and the memory capacity information $C_{0-3}=$"0001" are applied to the comparing circuit 217. As a result, the condition $D_{0-3} < C_{0-3}$ is satisfied, the comparing circuit 217 produces a signal of logical "1" to be applied to the other input terminal of the AND gate 218. Accordingly, the AND gate 218 is fully conditioned to produce a signal of logical "1". The logical "1" signal is then applied from the AND gate 218 to the output line 222. This state implies that the memory board #K 210 is selected. At this time, the data $D_{0-3}=$"0000" is added to the upper bits of the address information $A_{4-19}$ thereby to form an actual memory address. In other words, when the memory capacity of the memory board #K 210 is 64 KB, the addresses of 16 bits $A_{4-19}$ are sufficient to address memory circuit 200 with a capacity of 64 KB. Accordingly, by replacing the upper 4 bits ($A_{0-3}$) of the address information by the output $D_{0-3}=$"0000" of the subtraction circuit 215, a memory address is formed which specifies the memory locations by the memory chips 100 mounted on the memory board #K 210.

When the address information $A_{0-19}$ inputted from the terminal 216 of the 20-bit width indicates addresses higher than the address 128 K, the upper four bits $A_{0-3}$ of the address information are "xx 1 x" (x="0" or "1"). Accordingly, the 4-bit address information $A_{0-3}=$"xx1x" and the start address information $B_{0-3}=$"0001" are applied to the subtraction circuit 215. Similarly, the subtraction circuit 215 performs the subtraction $(A_{0-3})-(B_{0-3})$ and produces the result of the subtraction $D_{0-3}=$"xx1x" or "xxx1". At this time, the subtraction circuit 215 produces a signal of logical "0" as a BORROW signal which in turn is inverted by the inverter 221 to be a signal of logical "0". The logical "1" signal from the inverter is then applied to one of the input terminals of the AND gate 218. The information $D_{0-3}=$"xx1x" or "xxx1" and the memory capacity information $C_{0-3}=$"0001" are applied to the comparing circuit 217. The result of the comparison at this time is $D_{0-3} \geq C_{0-3}$. This relation fails to meet the relation $D_{0-3} < C_{0-3}$ to cause the comparing circuit 217 to produce a signal of logical "1". The comparing circuit 217 accordingly produces a signal of logical "0". The logical "0" signal is applied to the other input terminal of the AND gate 218. Accordingly, the AND gate 218 is not conditioned to produce a logical "0" signal onto the line 222. The result is no selection of the memory board #K 210.

The selection operation of the memory board #M 211 will be described. The start address information $B_{0-3}=$"0001" has been applied to one of the input terminals of the adder circuit 212 of the memory board #K 210. The information representing a memory capacity $C_{0-3}=$"0001" has been applied to one of the input terminals of the adder circuit 212. In the adder circuit 212, $(B_{0-3})+(C_{0-3})$ is performed, so that the adder circuit 212 produces the addition result "0010". The information "0010" is inputted to the terminal 230 of the 4-bit width of the memory board #M 211, by way of the 4-bit terminal 219 and the line 220 on the mother board. The information "0010" coming through the 4-bit terminal 230 becomes the start address information $B_{0-3}$ of the memory border #M 211. The start address of the memory bord #M 211 is the address 128 K, as seen from Table 1. As previously mentioned, the memory capacity of the memory board #M 211 is 64 KB ($C_{0-3}=$"0001"). Therefore, the address range of the memory board #M 211 are the addresses 128 to 192 K-1. Similarly, the start address information $B_{0-3}=$"0010" is applied to one of the input terminals of the subtractor circuit 235. The upper bits $A_{0-3}$ of the address information are applied to the other input terminal of the subtractor circuit 235. The address information $A_{0-3}$ is "xx1x", for example. The subtractor circuit 235 performs $(A_{0-3})-(B_{0-3})$, thereby to produce $D_{0-3}=$"xx0x". At this time if the address information $A_{0-3}$ is "0010", $D_{0-3}=$"0000". The information $D_{0-3}$ "0000" is inputted to one of the input terminals of the comparing circuit 237. The information $C_{0-3}$="0010" representing the memory capacity is applied to the other input terminal of the comparing circuit 237. Since the comparing condition $D_{0-3}-C_{0-3}$ is satisfied, the comparing circuit 237 produces a signal of logical "1". The logical "1" is applied to one of the input terminals of the AND gate 238. A BORROW signal of logical "0" produced from the subtractor circuit 235 is inverted by the inverter 231 to be a logical "1" signal which in turn is applied to the other input terminal of the AND gate 238. Accordingly, the AND gate 238 is fully conditioned to produce a logical "1" signal through the line 241. The result is the selection of memory board #M 211.

As described above, when the start address information $B_{0-3}$ of the memory board #M 211 with the memory capacity of 64 KB is "0010" (i.e. the start address indicates the addresses 128 K), the adresses of the memory board range from the addresses 128 K to 192 K-1, as seen from Table 2. When the address range is given, the upper address information $A_{0-3}$ of 4 bits is "0010". When the upper address information $A_{0-3}$ is "0010", the memory board #M 211 is selected, as seen from the above description.

Another embodiment of the invention, corresponding to the embodiment shown in FIG. 2 with only two memory boards, will be described referring to FIG. 3. When the number of memory boards used is limited to two, the invention may be practiced by using a combination of simple gates, without the adder circuit, the subtraction circuit, the comparing circuit and the like of FIG. 2. In FIG. 3, a plurality of memory chips 100 are mounted on memory boards #0 300 and #1 400 to form a memory circuit 200 with a plurality of memory locations.

Figure 3A:
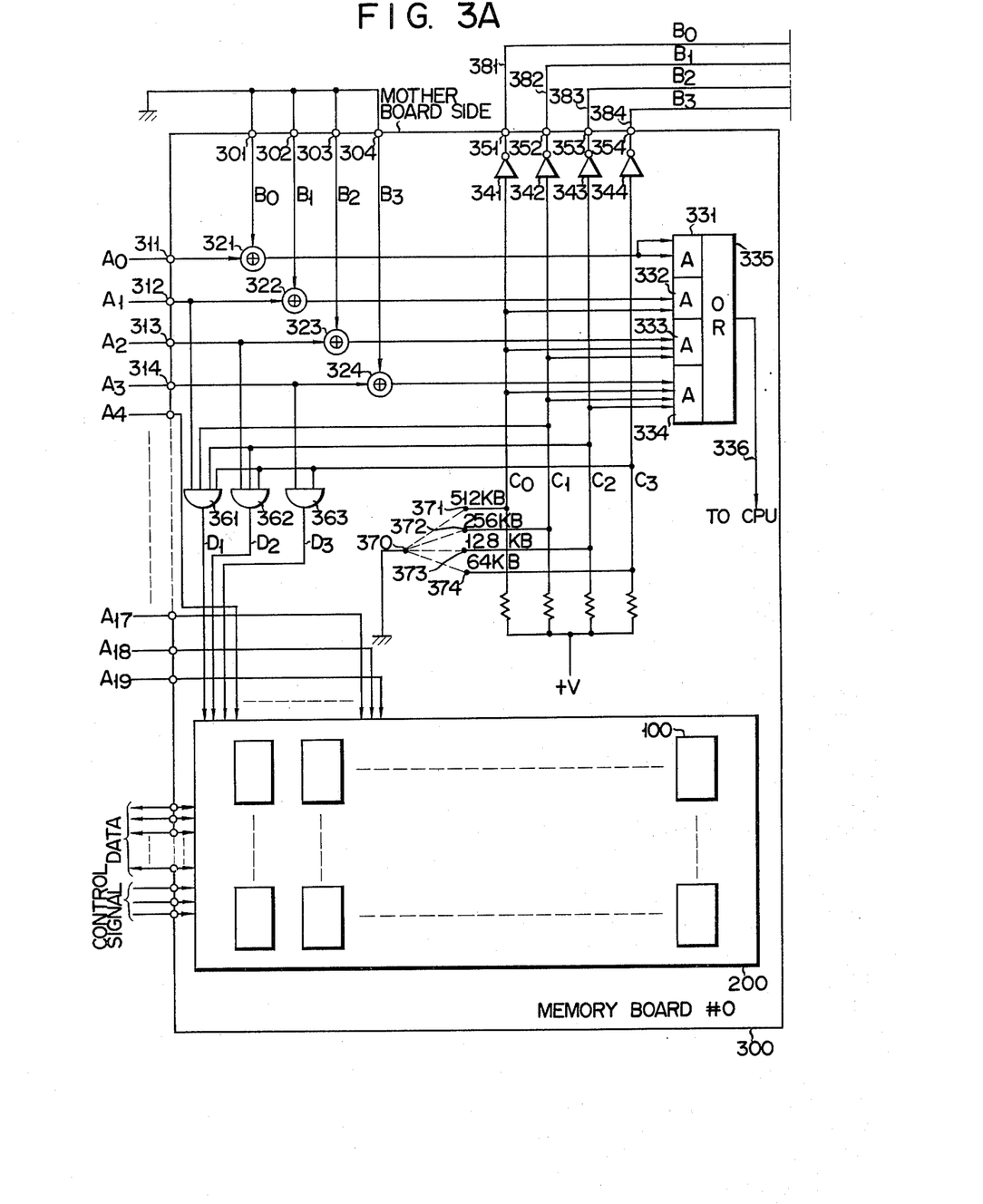
FIGS. 3A and 3B show a circuit diagram of the embodiment shown in FIG. 1 when only two memory boards are used.

For realizing the embodiment shown in FIG. 3, the following conditions must be satisfied: (i) a memory capacity of the memory board is $2^n$ KB where n is an integer; (ii) a memory capacity of the memory board #0 300 must be larger than or equal to that of the memory board #1 400. The memory boards with memory locations of 512 KB, 256 KB, 128 KB and 64 KB are formed by increasing or decreasing the number of memory chips mounted on a memory board for 512 KB, for example. Terminals 301 to 304 of the memory board #0 300 shown in FIG. 3A are grounded on a mother board (not shown). Ground information $B_{0-3}$="0000" is the start address of the memory board #0 300. The terminals 311, 312, 313 and 314 are input terminals of the upper four bits $A_{0-3}$ of address information. The lower 16 bits of the address information are omitted in the figure. Exclusive OR circuits 321 to 324 have the same function as that of the address subtractor circuit 161, for example, shown in FIG. 2. AND gates 331 to 334 and an OR gate 336 have the same functions as the AND gate 218 and the inverter 221 of the comparator 217. The same values may be applied to both inputs of the AND gate 331. This implies that commercially available integrated circuits of AND gates may be used for the AND gate.

The logic circuitry of this embodiment is so designed that when a signal on the output line 336 is logical "0", the memory #0 300 is selected, and that when a signal on the output line 436 of the OR gate 435 is logical "0", the memory board #1 400 is selected. Inverters 341 to 344 connected to terminals 351 to 354 are used to obtain the start address information of the next memory board #1 400. AND gates 361 to 363 produce the address information $D_1$ to $D_3$ to the upper bits of the address information $A_{4-19}$. Incidentally, this embodiment employs 512 KB for the maximum memory capacity of one memory board. Therefore, a 19 bit access made an access to the memory of 512 KB so that there is no need for a circuit to obtain the uppermost bit $D_0$ of the memory address. In manufacturing the memory board #0 300, a terminal 370 is jumper-wired with one of terminals 371 to 374 in order to obtain memory capacity information of the memory board #0 300. The terminal 370 is grounded at the other end with logical "0". The construction of the memory board #1 400 is the same as that of the memory board #0 300 and therefore the explanation of the board #1 400 will be omitted.

Figure 3B:
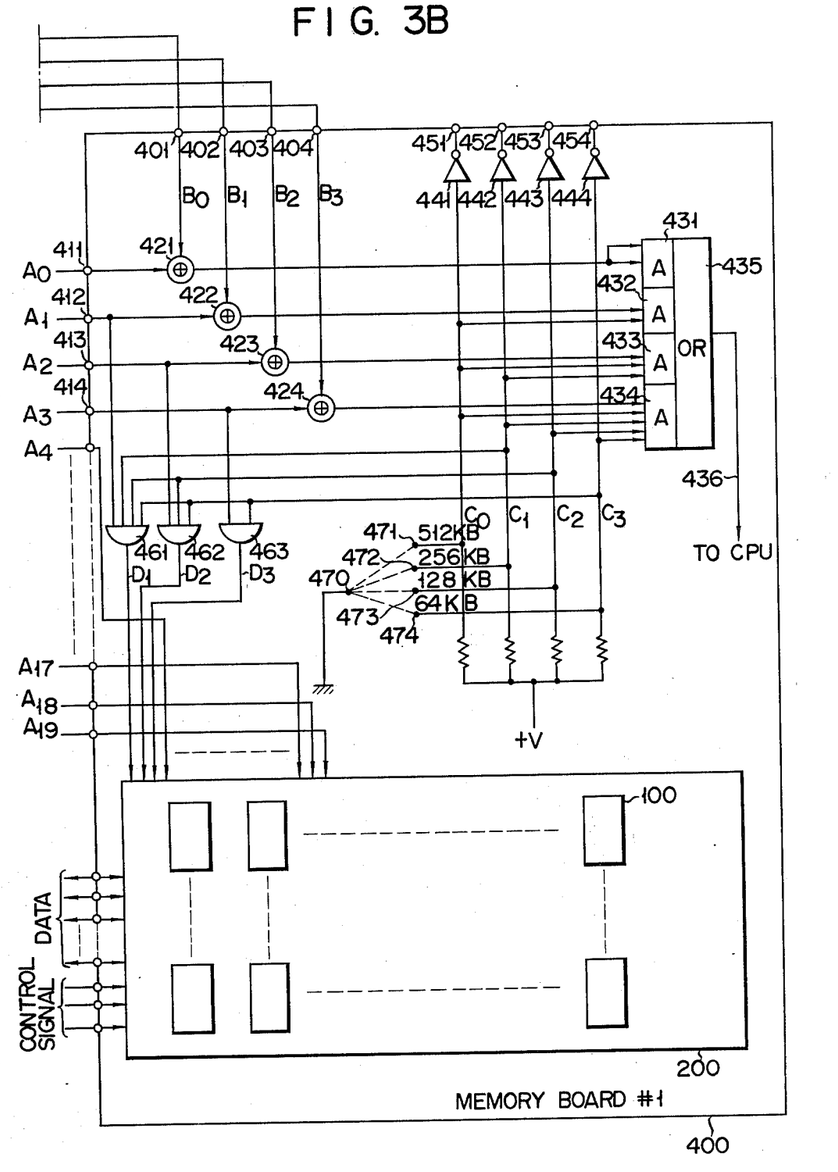

The operation of the embodiment shown in FIGS. 3A and 3B having the construction as mentioned above will be described hereunder. The memory board #0 300 is assumed to have a memory capacity of 512 KB. At the manufacturing stage of board #0 300, the terminals 370 and 371 are connected by a single jumper wire. Accordingly, the information $C_{0-3}$ representing a memory capacity of the memory board #0 300 is "0111". Since the terminals 301 to 304 are grounded in the mother board, the start address information is "0000". As seen from Table 2, an address range to make an access to the memory circuit 200 with a memory capacity of 512 KB mounted on the memory board #0 300 is the addresses 0 to 512 K-1.

Assume now that the address information $A_{0-19}$ inputted to the memory board #0 300 indicates the address with an address number larger than that of the address 512 K. In this case, the uppermost bit or most significant bit $A_0$ coming in through the terminal 311 is a logical "1". Incidentally, the circuit of this embodiment operates with a positive logic. The logical "1" signal is applied to one of the input terminals of the exclusive OR circuit 321. A signal $B_0$ of logical "0" is applied to the other input terminal of the exclusive OR circuit 321. Upon receipt of those signals, the exclusive OR circuit 321 produces a signal of logical "1". The logical "1" signal from the exclusive OR circuit 321 is sent out onto the output line 336, by way of the AND gate 331 and the OR gate 335. As described above, this embodiment is so designed that when the signal on the output line 336 from the OR gate 335 is logical "0", the memory board #0 300 is selected. In this case, however, the logical "1" signal is sent out onto the output line 336, so that the memory board #0 300 is not selected.

Let us consider a case where the address information $A_{0-19}$ inputted to the memory board #O 300 has an address range from the addresses 0 to 512 K-1. In this case, the MSB (the address $A_0$ applied to the terminal 311) of the address information $A_{0-19}$ is a logical "0". The signal $A_0$ of logical "0" and the signal $B_0$ of logical "0" are inputted to the input terminals of the exclusive OR circuit 321, so that the exclusive OR circuit 321 produces a signal of logical "0". Accordingly, the output signal of the AND gate 331 is also a logical "0". A logical "0" signal $C_0$ of the memory capacity information $C_{0-3}$="0111" has been applied to the AND gates 332 to 334. Accordingly, all the output signals from the AND gates 332 to 334 are logical "0". Therefore, the signals of logical "0" are applied to the OR gate 335, so that a signal of logical "0" is produced toward the output line 336 thereof. As a result, the memory board #0 300 is selected. At this time, the actual address to make an access to the memory circuit 200 formed by the memory chips mounted onto the memory board #0 300 is formed by adding the output information information $D_1$ to $D_3$ of the AND gates 361 to 363 to the upper bits of the address information $A_4$ to $A_{19}$. Logical "1" signals $C_1$ to $C_3$ have been applied to the AND gate 361. The logical "1" signals $C_2$ and $C_3$ have been applied to the AND gate 362. The logical "1" signal $C_3$ has been applied to the AND gate 363. Therefore, the output data $D_1$ to $D_2$ depend on the information $A_1$ to $A_3$. Therefore, the memory board #0 300 with the memory capacity of 64 KB is accessed by the addresses $A_{1-19}$ of 19 bits. The memory capacity information $C_0$ to $C_3$ (logical "0111") is inverted by inverters 341 to 344 to the logical "1000". The information signals are outputted through the terminals 351 to 354. Those signals through the terminals 351 to 354 are applied to the terminals 401 to 404 of the memory board #1 by way of the lines 381 to 384 on the mother board. Accordingly, the start address $B_{0-3}$ of the memory board #1 400 become "1000" to indicate the address 512 K. If the memory capacity of the memory board #1 400 is set to 128 KB, the memory capacity information $C_{0-3}$ is "1101". At the manufacturing stage of the memory board #1 400, the terminal 470 and the terminal 473 are connected by a single jumper wire in order to provide such a signal. Accordingly, an address range of the memory board #1 400 are the addresses 512 K to 640 K-1.

When the address information $A_0$ to $A_{19}$ inputted to the memory board #1 indicates the address with an address number smaller than that of the address 512 K-1, the MSB $A_0$ of the address information is a logical "0". The logical "0" signal is applied to one of the input terminals of the exclusive OR gate 421. A signal $B_0$ of logical "1" is applied to the exclusive OR circuit 421. Accordingly, the exclusive OR circuit 421 produces a signal of logical "1". The logical "1" signal is outputted through the AND gate 431 and the OR gate 435 to the output line 436. Thus, since a logical "1" appears on the output line 436, the memory board #1 400 is not selected.

When the address information $A_0$ to $A_{17}$ inputted to the memory board #1 400 indicates the addresses ranging from the address 512 K to 640 K-1, the upper 4 bits $A_{0-3}$ of the address information are logical "1000" or "1001". When the upper four bits $A_{0-3}$ are logical "1000", the logical state thereof is the same as the start address information $B_{0-3}$="1000" of the memory board #1 400. Therefore, the same value is applied to the exclusive OR circuits 421 to 424, so that those circuits 421 to 424 produce signals of logical "0". Accordingly, the logical "0" signal is applied to at least one input of each AND gate 431 to 434, with the result that those AND gates 431 to 434 produce signals of logical "0", and the logical "0" signal is outputted to the line 436 through the OR circuit 435. Consequently, when the address information indicates the addresses ranging from the address numbers 512 K to 640 K-1, the memory board #1 400 is selected.

Let us next consider a case that the upper four bits $A_{0-4}$ of the address information are logical "1001". In this case, the same logical values are applied to the two input terminals of each exclusive OR circuit 421 to 423. Accordingly, the exclusive OR circuits 421 to 423 produce signals of logical "0". Those signals are each inputted to one of the input terminals of each AND gate 431 to 433. The AND gates 431 to 433 produce signals of logical "0". At this time, applied to the exclusive OR circuit 424 are a logical "1" signal $A_0$ and a logical "0" signal $B_3$. In response to those input signals, the circuit 424 produces a logical "1" signal. The output signal of the logical "1" is applied to the AND gate 434. Since the memory capacity of the memory board #1 400 is 128 KB, the terminal 470 and the terminal 473 are wired by a jumper line. Accordingly, the information $C_{0-3}$ representing the memory capacity is logical "1101". The logical "0" signal $C_2$ of the information $C_{0-3}$ is applied to the AND gate 434. Then, the AND gate 434 produces a signal of logical "0", so that the logical "0" signals are applied to the OR circuit 435. As a result, a logical "0" signal is applied as a memory board selection signal to the output line 436. The result is the selection of the memory board #1 400. At this time, the memory address is formed by adding the output signals $D_1$ to $D_3$ from the AND gates 461 to 463 to the upper bits $A_4$ to $A_{19}$ of the address information. At this time, a signal $C_2$ of logical "0" representing the memory capacity has been applied to the AND gates 461 and 462, and the output signals $D_1$ and $D_2$ are logical "0". Since a signal $C_3$ of logical "1" representing the memory capacity is applied to one of the input terminals of the AND gate 463, the output signal $D_3$ depends on the $A_3$ bit of the address information. Therefore, the address 512 of the memory board #1 with a memory capacitor of 128 KB is treated as the address 0 of the memory board #1 400 and the memory circuit 200 is accessed by the address information within $A_{3-19}$.

Next, let us consider a case where the address information inputted to the memory board #1 400 indicates an address with an address number larger than 640 K. In this case, the upper four bits $A_{0-3}$ of the address information $A_{0-19}$ are "11xx". To the input terminal of the exclusive OR circuit 422 are applied an $A_1$ signal of logical "1" and a $B_1$ signal of logical "0". Upon receipt of those signals, the exclusive OR circuit 422 produces a logical "1" signal which in turn is applied to the AND gate 432. At this time, the AND gate 432 has received a signal $C_{01}$ of logical "1". Therefore, the AND gate 432 is enabled to produce a logical "1" signal which in turn is outputted to the output line 436, through the OR circuit 435. Accordingly, when the address information indicates an address with a 640 K or higher address number, the memory board #1 400 is not selected.

Figure 4A:
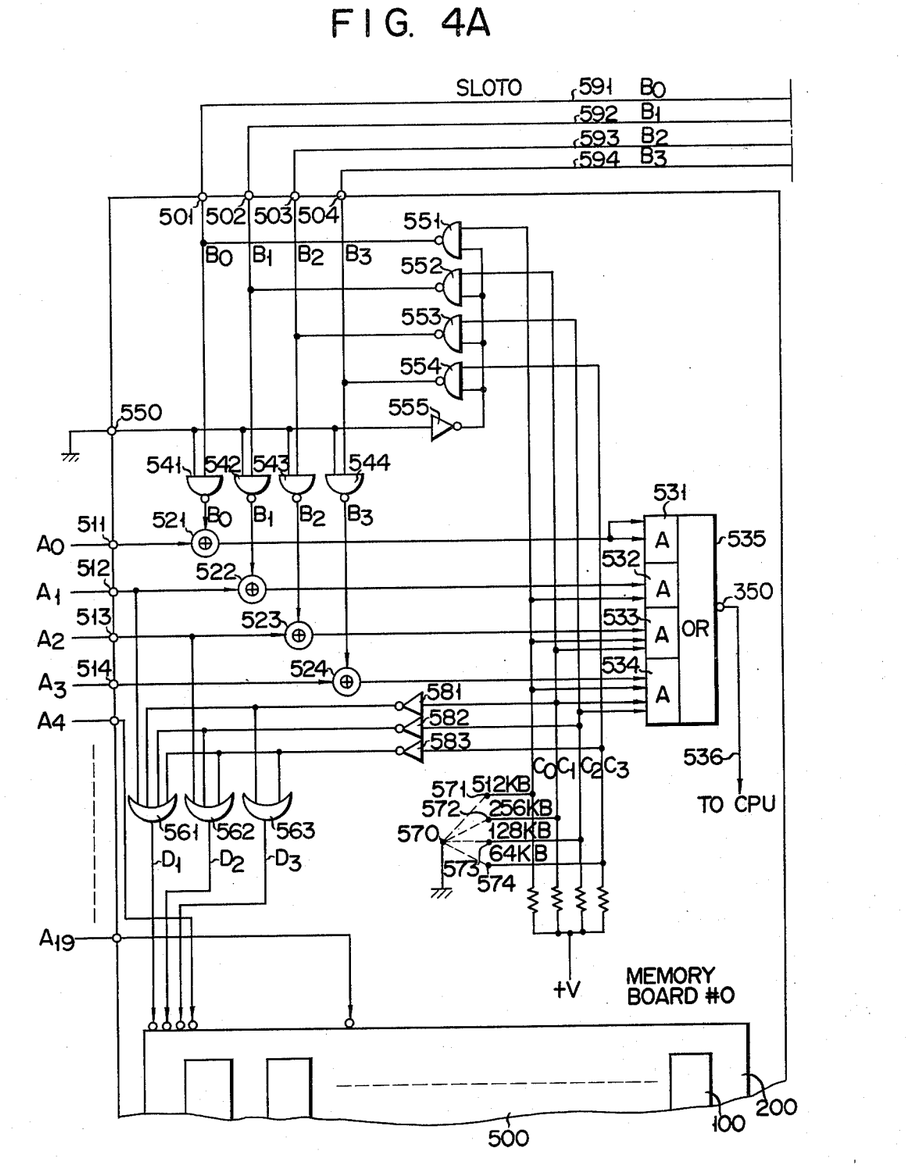
FIGS. 4A and 4B shows a circuit diagram of a modification of the embodiment shown in FIG. 3.
Figure 4B:
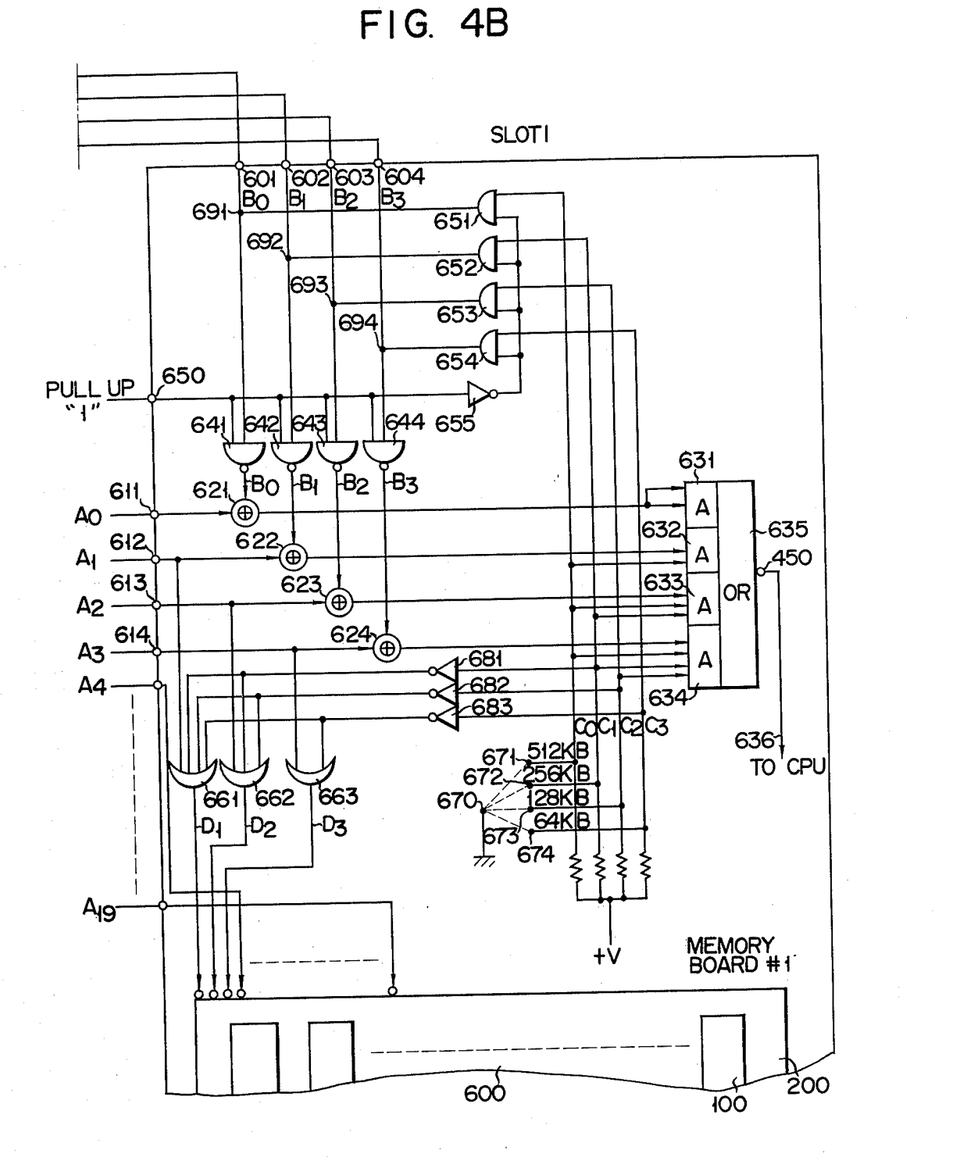

A modification of the embodiment shown in FIG. 3 is shown in FIG. 4. Also in FIG. 4, memory circuits 200 with a plurality of memory locations are formed on memory boards #0 500 and #1 600 by mounting a plurality of memory chips 100 those boards, respectively. In FIG. 4, those memory circuits are partially illustrated. In the FIG. 3 example, eight terminals are provided through which the start address passes are provided on each memory board. For example, the memory board #0 300 has the terminals 301 to 304 and the terminals 351 tp 354. On the other hand, the FIG. 4 embodiment commonly uses the same terminals for the input and the output of the start address information. For example, in the case of the memory board #0 500, only terminals 501 to 504 are used for the same purpose. For this reason, the inverters 341 to 344 shown in FIG. 3 are replaced by NAND gates 551 to 554 in this embodiment of FIG. 4. Also in this embodiment, the output signal from the inverter 555 serves as an input signal to those NAND gates 551 to 554. The output information $B_0$ to $B_3$ derived from NAND gates 541 to 544 are used for the start address. As shown, the output signals from the NAND gates 551 to 554 and a logical "0" signal coming through a terminal 550 connected to ground at one end are applied to the NAND circuits 541 to 544. In this embodiment, the start address information $B_{0-3}$ is derived from the NAND gates 541 to 544, so the polarity of the start address is opposite to that of the start address $B_{0-3}$ in FIG. 3. Further in this embodiment, when the memory board selection signal outputted through an OR gate 535, an inverter 414, and an output line is a logical "1", this state indicates that the memory board #0 500 is selected. Moreover, the upper three bits $D_1$ to $D_3$ of the memory address are obtained from OR gates 561 to 563. To effect this, the information $C_1$ to $C_3$ representing a memory capacity are applied to the OR gates 561 to 563, through inverters 581 to 583. The logic circuit in this embodiment is designed with a negative logic and a logical "0" state of each bit is effective for circuit operation. The circuit construction of the memory board #1 600 shown in FIG. 4B is the same as that of the memory board #0 500, except that one end of terminal 650 is pulled up to logical "1". With such an exception, the address information $A_{0-19}$ applied to the memory board #1 600 is of negative polarity, like the memory board #0 500. Additionally, the memory board #1 600 is selected when the memory board selection signal transferred through output line 636 of the memory board #1 600 is logical $\int 1$".

The operation of the embodiment shown in FIG. 4 will now be described.

Assume now that a memory capacity of the memory circuit 200 formed by a plurality of memory chips mounted on the memory board #0 500 is 256 KB. Accordingly, a terminal 570 is connected to a terminal 572 by a jumper wire in manufacturing the memory board #0 500. Information $C_{0-3}$ representing a memory capacity of the memory circuit 200 is "1011" and is applied to one of the input terminals of each NAND gate 551 to 554. A signal of logical "1" is applied to the other input terminal of each NAND gate 551 to 554, through the inverter 555. Accordingly, the logical states of the output signals from the NAND gates 551 to 554 are "0", "1", "0", and "0", respectively. Those signals are applied to one respective terminal of NAND gates 541 to 544. A logical "0" signal is applied to the other respective input terminal of AND gates 541 to 544, through the terminal 550. Accordingly, NAND gates 541 to 544 produce logical "1" signals. In other words, the start address $B_{0-3}$ of the memory board #0 500 is "1111" and indicates the address 0.

It is assumed that the address information $A_{0-19}$ inputted to the memory board #0 500 indicates the address with an address number larger 256 KB which is the memory capacity of the memory board #0 500. For example, if the information indicates the address 512, the four bits $A_{0-3}$ of the address information are "0111" since the address of this embodiment is set with a negative logic. Accordingly, signals of logical "0" and "1" are applied to the exclusive OR circuit 521. Further, signals of logical "1" are applied to the exclusive OR circuits 522 to 524. As a result, the exclusive OR circuit 521 produces a logical "1" signal and the exclusive OR circuits 522 to 524 produce signals of logical "0", respectively. The logical "1" signal produced from th exclusive OR circuit 521 is applied to the AND gate 531. The logical "0" signals produced from the exclusive OR circuits 522 to 524 are applied to the AND gates 532 to 534, respectively. Accordingly, the AND gate 531 produces a signal of logical "1", and the AND gates 532 to 534 produce signals of logical "0". And those signals are applied to the OR gate 535. As a result, the OR gate 535 produces a signal of logical "1" which is then inverted by inverter 350 to be a logical "0". The logical "0" signal is delivered onto the output line 536. Therefore, the memory board #0 500 is not selected, when the address information to make an access to an address exceeding the memory capacity (for example, 256 KB) of the memory board #0 500 defined by the number of the memory chips mounted thereon.

When the address information necessary to make an access to the memory board #0 500 with the memory capacity of 256 KB is within an address range from 0 to 256 K-1, the memory board #0 500, is selected. In this case, the upper four bits $A_{0-3}$ of the address information $A_{0-19}$ are logical "11xx" (xx=00, 01, 10 or 11). When the upper four bits $A_{0-3}$ of the address information are logical "1101", logical "1" signals are applied to the two inputs of each of the exclusive OR circuits 521, 522 and 524. At this time, the exclusive OR circuit 523 receives at its two input terminals a logical "1" and a logical "0" signal, respectively. Accordingly, the exclusive OR circuits 521, 522 and 524 produce logical "0" signals. The exclusive OR circuit 523 produces a logical "1" signal. The logical "0" signals from the exclusive OR circuits 521, 522 and 524 are applied to the AND gates 531, 532 and 534, respectively. Upon receipt of those signals, the AND gates 531, 532 and 534 produce logical "0" signals. Applied to the AND gate 533 are the logical "1" signal derived from the exclusive OR circuit 523, and a logical "1" signal $C_0$ and a logical "0" signal, which indicate a memory capacity. Therefore, the AND gate 533 produces a logical "0" signal. Accordingly, the AND gates 531 to 534 produce all logical "0" signals which are then applied to the OR gate 535. Then, the OR gate 535 produces a signal of logical "0". The logical "0" signal is inverted by the inverter 550 to be logical "1". The logical "1" from the inverter 550 is sent out onto the output line 536. Consequently, so long as the address information $A_{0-19}$ is within the range of the addresses 0 to 256 K-1, the memory board #0 500 is selected.

At this time, the logical "0" signal $C_1$ representing the memory capacity is inverted by the inverter 581 to be a logical "1" and the logical "1" signal is applied to the OR gate 561. The signal $C_2$ of logical "1" representing the memory capacity is applied to the inverter 582 where it is inverted to be a logical "0". The logical "0" signal from the inverter is then applied to the OR gates 561 and 562. The signal $C_3$ of logical "1" also representing the memory capacity is applied to the inverter 583 where it is inverted to be a logical "0" and the logical "0" signal is applied to the OR gates 561 to 563. Accordingly, the OR gate 561 produces a logical "1" signal designated as $D_1$. The signals $D_2$ and $D_3$ produced from the OR gates 562 and 563 are a logical "0" and "1", respectively, since the $A_2$ and $A_3$ address information bits of the address information are logical "0" and "1". The information $D_1$ to $D_3$ derived from the OR gates 561, 562 and 563 are added to the upper bits of the adress information $A_{4-19}$. The result is used as the address to make an access to the memory locations formed by the memory chips 100 mounted on the memory board #0 500. With respect to the memory board #0 500 with a memory capacity of 256 KB, the bits $D_2$ and $D_3$ and the 18 bits of the address information $A_{4-19}$ are used as the effective bits. The address information $D_1$ to $D_3$ and $A_{4-19}$ is inverted by an inverter so as to comply with the logic of the memory chips mounted on the memory board.

The output signals $B_{0-3}$ from the NAND gate 551, 552, 553 and 554, having logical states "0", "1", "0", "0", are applied from the terminals 501 to 504 to the terminals 601 to 604 of the memory board #1 600 in FIG. 4B, through the lines 591 to 594 on the mother board. The information $B_{0-3}$ having logical states "0", "1", "0", "0" produced from the terminals 601 to 604 are applied to one respective input terminal of the NAND gates 641 to 644. A logical "1" signal from the terminal 650 is applied to the other respective input terminal of the NAND gates 641 to 644. Accordingly, the NAND gates 641 to 644 produce the information $B_{0-3}$ of logical states "1011". The information "1011" indicates the start address, or the address 256 K, of the memory board #1 600. The start address 256 is treated as the address 0, as in the case of the above-mentioned embodiment.

Assume now that the memory board is so designed to have a memory capacity of 128 KB by mounting the corresponding number of memory chips onto the board. To this end, the terminals 670 and the terminal 673 are connected by a single jumper wire when the memory board is manufactured. Accordingly, the information $C_{0-3}$ indicates the memory capacity of the memory board #1 600 has logical states "1101". The logical "1101" signals are applied to a respective input terminal of NAND gates 651 to 654. A pull-up signal of logical "1" derived from the terminal 650 is inverted by the inverter 655 to be logical "0" and is applied to the other respective input terminal of the NAND gates 651 to 654. The NAND gates 651 to 654 produce logical "0" signals. The output lines coming from the NAND gates 651 to 654 and the output lines from the terminals $B_0$ to $B_3$ are so connected as to form wired-ANDs at the junctions 691 to 694. Accordingly, there is little influence of the input signals from the terminals $B_0$ to $B_3$ to the NAND gates 641 to 644. In other words, signals in accordance with the signals produced from the terminals $B_0$ to $B_3$ are inputted to the NAND gates 641 to 644. In this example, the information $B_{0-3}$ of logical "0100" is applied to one respective terminal of the NAND gates 641 to 644. The pullup signal of logical "1" is applied to the other respective input terminal of the NAND gates 641 to 644. Accordingly, the NAND gates 641 to 644 produce the information of logical "1011". This indicates that the start address information ($B_{0-3}$ = "1011") of the memory board #1 600 is the address 256 K. As seen from Table 2, the address range of the memory board #1 600 with the memory capacity of 128 KB is 256 K to 384 K-1.

Assume now that the address information $A_0$ to $A_{19}$ inputted to the memory board #1 600 indicates the address with an address number smaller than that of the address 256. The upper two bits $A_0$ and $A_1$ of the address information are logical "1". Accordingly, a signal $A_1$ of logical "1" and a signal $B_1$ of logical "1" are applied to the exclusive OR circuit 622. The exclusive OR circuit 622 produces a signal of logical "1" for application to one of the input terminals of the AND gate 632. Further, a logical "0" signal $C_0$ is applied to the other input terminal of the AND gate 632. Therefore, the AND gate 632 produces a signal of logical "1". As a result, a logical "1" signal is applied to the OR circuit 635, and the OR circuit 635 produces a logical "1" signal. The logical "1" from the OR circuit 635 is inverted by the inverter 450 and the inverted signal is outputted to the output line 636. Accordingly, a resulting address information smaller than the address 256 K fails to select the memory board #1 600.

When the address information $A_{0-19}$ of the memory board #1 600 indicates an address range from 256 K to 384 K-1, the upper four bits $A_{0-3}$ of the address information are "101x" (x = "1" or "0"). We will proceed with the description of the embodiment of FIG. 4 on the assumption that the upper four bits $A_{0-3}$ are logical "1010". The signals $A_0$ and $B_0$ of logical "1" are applied to the two input terminals of the exclusive OR circuit 621. Signals $A_1$ and $B_1$ of logical "0" are applied to the two input terminals of the exclusive OR circuit 622. The exclusive OR circuit 623 is supplied at the two inputs with logical "1" signals $A_2$ and $B_2$. A logical "0" signal $A_3$ is applied to one of the input terminals of the exclusive OR circuit. A logical "1" signal $B_3$ is applied to the other input terminal of the OR circuit 624. The exclusive OR circuits 621 to 623 produce signals of logical "0". The remaining exclusive OR circuit 624 produces a signal of logical "1". Accordingly, the exclusive OR circuits 621 to 623 apply the logical "0" signals to the exclusive OR circuits 631 to 633, respectively, so that those AND gates 631 to 633 produce signals of logical "0". Although the logical "1" from the exclusive OR circuit 624i applied to the AND gate 634, a logical "0" signal is applied to the other input terminal thereof. The AND gate 634 therefore also produces a logical "0" signal. This logical state causes the OR gate 635 to produce a logical "0" signal. The signal of logical "0" is inverted by the inverter 450 and delivered to the output line 636. Accordingly, the address information with an address range falling within the addresses 256 K to 384 K-1 selects the memory board #1 600. The memory address in this case is formed by adding the output information $D_1$ to $D_3$ from the OR gates 661 to 663 to the upper OR gates 661 to 663 to the upper bits of the address information $A_4$ to $A_{19}$, respectively. The logical "0" signal $C_2$ is inverted by the inverter 682 and the inverted signal is applied to the OR gates 661 and 662. Accordingly, the OR gates 661 to 662 produce signals of logical "1". The signal $C_3$ of logical "1" inverted by the inverter 683 has been applied to the OR gate 663, so that the OR gate 663 produces a desired logical signal in accordance with the contents of the bit $A_3$ of the address information. Since the bit $A_3$ is selected as a logical "0" as previously stated, a signal of logical "0" (effective bit) is produced from the OR gate 663. Accordingly, 19 bits of the bits $D_{1-3}$ and $A_{4-19}$ are used for the signal to make an access to the memory board #1 600 with a memory capacity of 128 KB; the effective bits are actually $D_3$ AND $A_{4-19}$, i.e. 17 bits. The logical states of bit signals $D_{1-3}$ and $A_{4-19}$ are made to comply with those of the logical signals from the memory chips 100 mounted onto the memory board #1 600. Accordingly, in the memory board #1 600, the address 256 K is used as the logical address 0 thereof and may be accessed by an address within the range of the address information $A_{3-19}$.

When the address information applied to the memory board #1 600 is larger than the address 384, the upper four bits $A_{0-3}$ are logical "x00x" or "0xxx" (the symbol x may be "1" or "0"). Accordingly, the address bit $A_0$ and/or $A_2$ is a logical "0" (effective bit) and the exclusive OR circuit 621 and/or 623 produces a logical "1" signal. Therefore, AND gate 631 and/or AND gate 633 produces a logical "1" signal. The logical "1" signal produced is applied to the inverter 450 which in turn produces a logical "0" on the output line 636. Accordingly, when an address information larger than the address 384 K is inputted to the memory board #1 600, the memory board #1 600 is not selected. Incidentally, the selection signal of each memory board (for example, the signals 222, 241) is wired as an OR connection and applied to the central processing unit. The central processing unit receives the selection signal to indicate that the memory board is selected.

What is claimed is:

1. A memory board in which a plurality of memory locations are arranged thereon by mounting a plurality of memory chips, comprising:
   (A) first terminals for receiving address information for specifying one of said memory locations;
   (B) second terminals for receiving start address information corresponding to the first memory location of those memory locations;
   (C) means for supplying memory capacity information representing a capacity of the plurality of memory locations;
   (D) addition means for adding the start address information to the memory capacity information;
   (E) third terminals through which the output information of said addition means is outputted;
   (F) subtraction means for subtracting the start address information from the address information; and
   (G) means for producing a selection signal for selecting a memory board when the information (the address information—the start address information) outputted from the subtraction means is given by the following expression:
   $0 \leq$ (the address information—the start address information) < the memory capacity information.

2. A memory board according to claim 1, wherein said means for supplying the memory capacity information is supplied by wiring a jumper line to represent the memory capacity when said memory board is manufactured.

3. A memory board according to claim 1, wherein the information outputted from said third terminals of a memory board when the plurality of memory boards are inserted into a mother board, is supplied to said second terminals of the next memory board through the wiring on the mother board.

4. A memory board according to claim 1, wherein said start address information is taken as the address 0 within the memory board by means of said subtractor means.

5. A memory board according to claim 1, wherein the information outputted from said subtractor means is used as the address to specify one of the memory locations within the memory board.

6. A memory board according to claim 1, wherein said means for producing the selection signal includes a comparing circuit for comparing the output information from said subtractor means with the memory capacity information, and a gate circuit into which a signal as an inversion of a borrow signal outputted from said subtractor circuit and an output signal from said comparing circuit are applied.

7. A memory board in which a plurality of memory locations $2^m K$ to $2^n K$ (m and n are integers, $m < n$, and $K = 1,024$) are supplied by mounting a discretionary number of memory chips on the memory board, comprising:

(A) first terminals for receiving address information for specifying memory locations of $2^{n+a}K$ (a is an integer of 1 or more);
(B) second terminals for receiving start address information of a train of bits $(n+a-m)$ for the start address location of the plurality of memory locations;
(C) means for jumper-wiring one of the terminals of $(n+a-m)$ to produce memory capacity information of $(n+a-m)$ bits representing the plurality of the memory locations;
(D) addition means for adding the start address information of a train of the $(n+a-m)$ bits to the memory capacity information of a train of the $(n+a-m)$ bits;
(E) third terminals through which the output information of said addition means is outputted;
(F) means for subtracting the start address information of a train of the $(n+a-m)$ bits from the address information ranging from $2^m K$ bits to $2^{n+a}K$ bits of those pieces of information;
(G) means for producing a selection signal for selecting a memory board when the output information from said subtraction means is given by the following expression:
$0 \leq$ (address information ranging from $2^m K$ bits to $2^{n+a}K$ bits—start address information of a train of $(n+a-m)$ bits < memory capacity information of a train of $(n+a-m)$ bits;
(H) means for taking as the address for specifying the plurality of memory locations the information which the sum of the upper bits of the address information of $2^{m-1}K$ bits or less of the information supplied from said first terminals and the output information of said subtraction means.

8. A memory board according to claim 1 or 7, wherein, when a plurality of the memory boards are inserted into a mother board, an address range of each memory board is automatically set by the output information of said addition means of the preceding memory board and the memory capacity information previously prepared on said each memory board.

9. A memory board in which a plurality of memory locations $2^m K$ to $2^n K$ (m and n are integers, $m < n$, and $K = 1,024$) are supplid by mounting a discretionary number of memory chips on the memory board;
(A) first terminals for receiving address information for specifying memory locations of $2^{m+1}K$;
(B) second terminals for receiving start address information of a train of $(n+1-m)$ bits for the first address location of the plurality of memory locations;
(C) means for jumper-wiring one of the terminals of $(n+1-m)$ to produce memory capacity information $(n+1-m)$ bits representing the plurality of memory locations;
(D) third terminals through which an inversion of the start address information of the $(n+1-m)$ bits is outputted;
(E) exclusive OR circuits of $(n+1-m)$ bits into which the address information of ($2^m K$ bits to $2^{n+1}K$ bits) and the start address information of $(n+1-m)$ are correspondingly applied;
(F) logical gate means for producing a board selection signal when the most significant bit of logical "1" signals produced from said exclusive OR circuits of $(n+1-m)$ is smaller than the most significant bit to address the memory capacity given by the terminal jumper-wired, or when the output signals from said exclusive OR circuits of $(n+1-m)$ are all logical "0"; and (G) means for specifying the plurality of memory locations for using the address information necessary for addressing the memory capacity given by the terminal jumper-wired of those pieces of address information.

10. A memory board in which a plurality of memory locations $2^m K$ to $2^n K$ (m and n are integers, $m < n$, and $K = 1,024$) are supplied by mounting a discretionary number of memory chips on the memory board, (A) first terminals for receiving address information for specifying memory locations $2^{n+1}K$;

(B) second terminals for receiving information of $(n+1-m)$ bits;

(C) third terminals for receiving logical information of logical "0" or "1";

(D) first logic gate means for receiving the logical information coming from said third terminals and information of $(n+1-m)$ bits coming from said second terminals and for responding to both the information to supply the start address to the first memory location of the plurality of the memory locations;

(E) means for jumper-wiring one of the terminals of $(n+1-m)$ to produce memory capacity information of $(n+1-m)$ bits representing the plurality of the memory locations;

(F) second logic gate means for receiving the memory capacity information of $(n+1-m)$ bits and the information as an inversion of the logical information coming from said third terminals, and for producing the information to the corresponding second terminals;

(G) exclusive OR circuits $(n+1-m)$ for receiving the address information of ($2^m K$ bits to $2^{n+1}K$ bits) and the start address information of $(n+1-m)$ bits;

(H) third logic gate means for producing a board selection signal when the most significant bit of logical "1" signals produced from said exclusive OR circuit of $(n+1-m)$ is smaller than the most significant bit to address the memory capacity given by the terminal jumper-wired, or when the output signals from said exclusive OR circuits of $(n+1-m)$ are all logical "0"; and (I) means for specifying the plurality of memory locations for using the address information necessary for addressing the memory capacity given by the terminal jumper-wired of those pieces of information.

11. A memory board according to claims 9 and 10, wherein when a first memory board is inserted into a slot 0 of a mother board and a second memory board is inserted into a slot 1 of the mother board, the memory capacity of said first memory board is equal to that of said second memory board or the memory capacity of said second memory board is larger than that of said second memory board.

12. A memory board according to claim 10, wherein, when a first memory board is inserted into a slot 0 of a mother board and a second memory board is inserted into a slot 1 of the mother board, a logical "0" signal is supplied through said third terminals of said first memory board and a logical "1" signal is supplied to said third terminals of said second memory board.

* * * * *

UNITED STATES PATENT AND TRADEMARK OFFICE
CERTIFICATE OF CORRECTION

PATENT NO. : 4,354,258
DATED : October 12, 1982
INVENTOR(S) : Fumitaka Sato

It is certified that error appears in the above—identified patent and that said Letters Patent is hereby corrected as shown below:

Col. 1, line 23, change "for" to --of--.

Col. 2, line 8, after "board", insert --and--.

Col. 2, line 9, delete "an".

Col. 2, line 10, delete "of".

Col. 2, line 47, change "shows" to show".

Col. 3, line 57, after "be" delete "given".

Col. 3, line 60, change "board #110" to --board #1 110--.

Col. 7, lines 30-31, change "$D_0-1$" to --$D_0-3$--.

Col. 8, line 55, correct spelling of "board--.

Col. 9, line 4, change "$D_0-3 - C_0-3$" to --$D_0-3 < C_0-3$--.

Col. 9, line 18, change "adresses" to --addresses--.

Col. 10, line 4, after "access" insert --can be--.

Col. 10, line 25, change "the" to --a--.

Col. 11, line 1, delete "information" second occurrence.

Col. 11, line 13, change "the" first occurrence to --be--.

Col. 12, line 24, change "capacitor" to --capacity--.

Col. 12, line 53, change "tp" to --to--.

UNITED STATES PATENT AND TRADEMARK OFFICE
CERTIFICATE OF CORRECTION

PATENT NO. : 4,354,258
DATED : October 12, 1982
INVENTOR(S) : Fumitaka Sato

It is certified that error appears in the above—identified patent and that said Letters Patent is hereby corrected as shown below:

Col. 13, line 24, change "$\int 1$" to --1--.

Col. 13, line 49, after "larger" insert --than--.

Col. 13, line 60, correct spelling of "the".

Col. 14, line 35, change "550" to --350--.

Col. 14, line 36, change "550" to --350--.

Col. 14, line 57, after "1", insert --respectively--.

Col. 14, line 59, correct spelling of "address--.

Col. 15, line 41, after "respective", insert --input--.

Col. 16, line 25, change "624i" to --624 is--.

Signed and Sealed this

Twelfth Day of April 1983

[SEAL]

Attest:

Attesting Officer

GERALD J. MOSSINGHOFF

Commissioner of Patents and Trademarks